(12) United States Patent
Zhang

(10) Patent No.: US 12,387,656 B2
(45) Date of Patent: Aug. 12, 2025

(54) DISPLAY DEVICE

(71) Applicant: TCL China Star Optoelectronics Technology Co., Ltd., Guangdong (CN)

(72) Inventor: Zhaoke Zhang, Guangdong (CN)

(73) Assignee: TCL China Star Optoelectronics Technology Co., Ltd., Shenzhen (CN)

( * ) Notice: Subject to any disclaimer, the term of this patent is extended or adjusted under 35 U.S.C. 154(b) by 0 days.

(21) Appl. No.: 17/289,770

(22) PCT Filed: Feb. 26, 2021

(86) PCT No.: PCT/CN2021/078148
§ 371 (c)(1),
(2) Date: Nov. 9, 2023

(87) PCT Pub. No.: WO2022/170646
PCT Pub. Date: Aug. 18, 2022

(65) Prior Publication Data
US 2024/0078960 A1    Mar. 7, 2024

(30) Foreign Application Priority Data
Feb. 9, 2021   (CN) .......................... 202110177855.1

(51) Int. Cl.
*G09G 3/32*       (2016.01)
*H05K 1/18*       (2006.01)

(52) U.S. Cl.
CPC ................. *G09G 3/32* (2013.01); *H05K 1/18* (2013.01); *G09G 2320/0233* (2013.01); *H05K 2201/10128* (2013.01)

(58) Field of Classification Search
CPC .. G06F 13/4022; G06F 13/4068; G06F 1/185; G06F 1/188
See application file for complete search history.

(56) References Cited

U.S. PATENT DOCUMENTS

| | | | | |
|---|---|---|---|---|
| 10,504,424 B2 * | 12/2019 | Lim | ...................... | H10K 59/131 |
| 10,593,264 B2 * | 3/2020 | Wang | .................... | G09G 3/3233 |
| 11,189,207 B2 * | 11/2021 | Jeon | ......................... | H05K 1/18 |
| 11,250,764 B2 * | 2/2022 | Sun | ....................... | G09G 3/2096 |
| 11,362,304 B2 * | 6/2022 | Lee | ....................... | H10K 59/131 |

(Continued)

FOREIGN PATENT DOCUMENTS

| | | |
|---|---|---|
| CN | 104091818 | 10/2014 |
| CN | 108022964 | 5/2018 |
| CN | 108364982 | 8/2018 |

(Continued)

*Primary Examiner* — Van N Chow

(57) ABSTRACT

A display device is disclosed. The display device allows a difference value between terminal voltages of light-emitting devices on two adjacent rows of a display substrate to be less than a target difference value by reversing a position of a power supply input terminal of one of power supply signal lines from a position adjacent to a printed circuit board to a position away from the printed circuit board, thereby correspondingly reducing a difference value between currents. Therefore, a brightness difference between the light-emitting devices of each row can be reduced to an extent that cannot be easily recognized by human eyes, thereby improving display quality of the display device.

16 Claims, 7 Drawing Sheets

(56) References Cited

U.S. PATENT DOCUMENTS

2006/0022969 A1    2/2006  Lee et al.

FOREIGN PATENT DOCUMENTS

| | | |
|---|---|---|
| CN | 109273490 | 1/2019 |
| CN | 109686312 | 4/2019 |
| CN | 110310976 | 10/2019 |
| CN | 110649059 | 1/2020 |
| CN | 111696488 | 9/2020 |
| CN | 111785743 | 10/2020 |
| TW | 200410589 | 6/2004 |

* cited by examiner

DISPLAY DEVICE

This application is a National Phase of PCT Patent Application No. PCT/CN2021/078148 having International filing date of Feb. 26, 2021 which claims the benefit of priority of Chinese Patent Application No. 202110177855.1 filed on Feb. 9, 2021. The contents of the above applications are all incorporated by reference as if fully set forth herein in their entirety.

TECHNICAL FIELD

The present disclosure relates to the field of display technologies, and more particularly, to a display device.

BACKGROUND

Organic light-emitting diode (OLED) display panels have many advantages such as self-illumination, low driving voltages, high luminous efficiency, short response times, high clarity and contrast, having a viewing angle near 180 degrees, a wide range of operating temperature, and ability to achieve flexible display and full color display in a large area.

With development of display technologies, sub-millimeter light emitting diodes (mini-LEDs) and micro-light-emitting diodes (micro-LEDs) have become an important direction for development of the display technologies since they have a luminous effect similar to organic light-emitting diodes and have a large cost advantage.

At present, illumination of display devices mainly depends on two power supply signals VDD and VSS. FIG. 1 shows a schematic structural diagram of a display device. FIG. 2 shows a schematic equivalent circuit diagram of pixel drive in the display device. Referring to FIG. 1, in the display device, a display area is provided with a plurality of pixel units 111 arranged in a matrix.

At present, there are mainly two ways to drive the pixel units 111, 2T1C and 1T1MOS, but are not limited to these. Taking 1T1MOS as an example, referring to FIG. 2, in a case of ignoring an internal resistance of an MOS tube, a current flowing through an organic light-emitting diode, $I=(VDD-VSS)/R_{LED}$. Since cross-sectional areas of a VDD power supply signal line 130 and a VSS power supply signal line 140 are usually smaller, predetermined resistances are inevitably generated (that is existences of a resistance R0 of each row in the VDD line and a resistance R1 of each row in the VSS line). As such, along a direction from one side adjacent to a printed circuit board (PCB, same as described below) 120 to one side away from the printed circuit board 120, a VDD voltage value of each row on a display substrate 110 is gradually reduced, while a VSS voltage value of each row is gradually increased. Therefore, a voltage ($\Delta V=VDD-VSS$) applied to both ends of organic light-emitting diodes 150 of each row is gradually reduced, and the current I is also reduced correspondingly in sequence, thereby causing brightness to reduce from the side adjacent to the printed circuit board 120 to the side away from the printed circuit board 120. If a brightness difference between the organic light-emitting diodes 150 of each row is overly large, human vision will feel obvious uneven brightness, thereby affecting display quality of the display device.

SUMMARY

An embodiment of the present disclosure provides a display device. The display device allows a difference value between terminal voltages of light-emitting devices (including, for example, the organic light-emitting diodes) on two adjacent rows along a direction from adjacent to the printed circuit board to away from the printed circuit board to be less than a target difference value by reversing a position of a power supply input terminal of one of power supply signal lines from a position adjacent to the printed circuit board to a position away from the printed circuit board, thereby correspondingly reducing a difference value between currents. Therefore, a brightness difference between the light-emitting devices of each row can be reduced to an extent that cannot be easily recognized by human eyes, thereby improving the display quality of the display device.

According to one aspect of the present disclosure, the present disclosure provides a display device, which includes: a display substrate, wherein, a plurality of light-emitting devices are disposed on the display substrate in an array; a printed circuit board disposed on one side of the display substrate; and a first power supply signal line and a second power supply signal line both configured to provide power supply signals to the light-emitting devices; wherein, when a first power supply input terminal of the first power supply signal line is disposed on one side adjacent to the printed circuit board and a second power supply input terminal of the second power supply signal line is disposed on one side away from the printed circuit board, along a direction from adjacent to the printed circuit board to away from the printed circuit board, a difference value between terminal voltages of the light-emitting devices on two adjacent rows is less than a target difference value to allow brightness of the light-emitting devices on each row of the display substrate to be substantially unchanged; a width of the first power supply signal line away from the printed circuit board is greater than a width of the first power supply signal line adjacent to the printed circuit board; and a width of the second power supply signal line away from the printed circuit board is greater than a width of the second power supply signal line adjacent to the printed circuit board.

Based on the above solutions, the present disclosure can be improved as follows.

In at least some embodiments of the present disclosure, the first power supply signal line extends from the side adjacent to the printed circuit board toward the side away from the printed circuit board, and the second power supply signal line extends from the side away from the printed circuit board toward the side adjacent to the printed circuit board.

In at least some embodiments of the present disclosure, the first power supply signal line includes a patterned structure.

In at least some embodiments of the present disclosure, the second power supply signal line includes a patterned structure.

In at least some embodiments of the present disclosure, the first power supply signal line on the side adjacent to the printed circuit board includes a plurality of first hollowed-out parts, the first power supply signal line on the side away from the printed circuit board includes a plurality of second hollowed-out parts, and a number of the first hollowed-out parts is greater than a number of the second hollowed-out parts.

In at least some embodiments of the present disclosure, the second power supply signal line on the side adjacent to the printed circuit board includes a plurality of third hollowed-out parts, the second power supply signal line on the side away from the printed circuit board includes a plurality of fourth hollowed-out parts, and a number of the third hollowed-out parts is greater than a number of the fourth hollowed-out parts.

In at least some embodiments of the present disclosure, the first power supply signal line and the second power supply signal line are disposed on different film layers of the display substrate.

In at least some embodiments of the present disclosure, materials of the first power supply signal line and the second power supply signal line are same.

In at least some embodiments of the present disclosure, values of the terminal voltages of the light-emitting devices on each row of the display substrate are unchanged.

According to another aspect of the present disclosure, the present disclosure provides a display device, which includes: a display substrate, wherein, a plurality of light-emitting devices are disposed on the display substrate in an array; a printed circuit board disposed on one side of the display substrate; and a first power supply signal line and a second power supply signal line both configured to provide power supply signals to the light-emitting devices; wherein, when a first power supply input terminal of the first power supply signal line is disposed on one side adjacent to the printed circuit board and a second power supply input terminal of the second power supply signal line is disposed on one side away from the printed circuit board, along a direction from adjacent to the printed circuit board to away from the printed circuit board, a difference value between terminal voltages of the light-emitting devices on two adjacent rows is less than a target difference value to allow brightness of the light-emitting devices on each row of the display substrate to be substantially unchanged;

In at least some embodiments of the present disclosure, the first power supply signal line extends from the side adjacent to the printed circuit board toward the side away from the printed circuit board, and the second power supply signal line extends from the side away from the printed circuit board toward the side adjacent to the printed circuit board.

In at least some embodiments of the present disclosure, a width of the first power supply signal line away from the printed circuit board is greater than a width of the first power supply signal line adjacent to the printed circuit board.

In at least some embodiments of the present disclosure, a width of the second power supply signal line away from the printed circuit board is greater than a width of the second power supply signal line adjacent to the printed circuit board.

In at least some embodiments of the present disclosure, the first power supply signal line includes a patterned structure.

In at least some embodiments of the present disclosure, the second power supply signal line includes a patterned structure.

In at least some embodiments of the present disclosure, the first power supply signal line on the side adjacent to the printed circuit board includes a plurality of first hollowed-out parts, the first power supply signal line on the side away from the printed circuit board includes a plurality of second hollowed-out parts, and a number of the first hollowed-out parts is greater than a number of the second hollowed-out parts.

In at least some embodiments of the present disclosure, the second power supply signal line on the side adjacent to the printed circuit board includes a plurality of third hollowed-out parts, the second power supply signal line on the side away from the printed circuit board includes a plurality of fourth hollowed-out parts, and a number of the third hollowed-out parts is greater than a number of the fourth hollowed-out parts.

In at least some embodiments of the present disclosure, the first power supply signal line and the second power supply signal line are disposed on different film layers of the display substrate.

In at least some embodiments of the present disclosure, materials of the first power supply signal line and the second power supply signal line are same.

In at least some embodiments of the present disclosure, values of the terminal voltages of the light-emitting devices on each row of the display substrate are unchanged.

The display device provided in the embodiments of the present disclosure allows the difference value between the terminal voltages of the light-emitting devices (including, for example, organic light-emitting diodes) on two adjacent rows along the direction from adjacent to the printed circuit board to away from the printed circuit board to be less than the target difference value by reversing a position of a power supply input terminal of one of power supply signal lines from a position adjacent to the printed circuit board to a position away from the printed circuit board, thereby correspondingly reducing a difference value between currents. Therefore, a brightness difference between the light-emitting devices of each row can be reduced to an extent that cannot be easily recognized by human eyes, thereby optimizing a current drive architecture of the display device and improving display quality of the display device.

DESCRIPTION OF THE DRAWINGS

The following detailed description of specific embodiments of the present disclosure will make the technical solutions and other beneficial effects of the present disclosure obvious with reference to the accompanying drawings.

DETAILED DESCRIPTION

The technical solutions in the embodiments of the present disclosure will be clearly and completely described below with reference to the drawings in the embodiments of the present disclosure. Obviously, the described embodiments are only a part of the embodiments of the present disclosure, but not all the embodiments. Based on the embodiments in the present disclosure, all other embodiments obtained by those skilled in the art without creative efforts are within the scope of the present disclosure.

In the description of the present disclosure, it should be noted that unless there are express rules and limitations, the terms such as "mount," "connect," and "bond" should be comprehended in broad sense. For example, it can mean a permanent connection, a detachable connection, or an integrated connection; it can mean a mechanical connection, an electrical connection, or can communicate with each other; it can mean a direct connection, an indirect connection by an intermediary, or an inner communication or an inter-reaction between two elements. A person skilled in the art should understand the specific meanings in the present disclosure according to specific situations.

Figure 3:
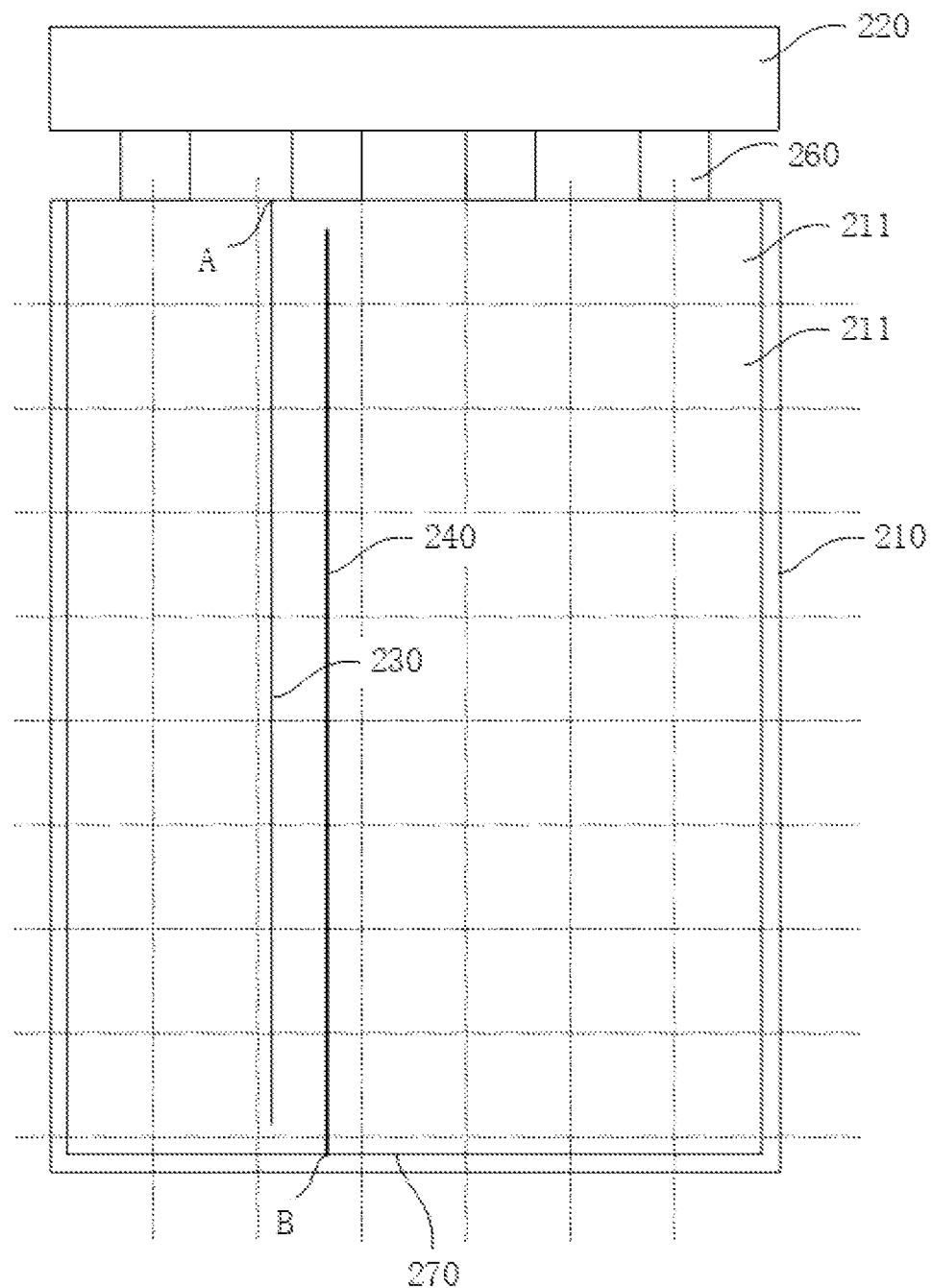
FIG. 3 is a schematic structural diagram of a display device according to an embodiment of the present disclosure.

Referring to FIG. 3, FIG. 3 is a schematic structural diagram of a display device according to an embodiment of the present disclosure.

In an embodiment of the present disclosure, the display device is provided. The display device includes: a display substrate 210, wherein, a plurality of pixel circuits 211 (corresponding to pixel units) and a plurality of light-emitting devices (referring to 150 shown in FIG. 2) are disposed on the display substrate 210, the pixel circuits 211 correspond to the light-emitting devices by one to one, and the light-emitting devices are arranged in an array; a printed circuit board 220 disposed on one side of the display substrate 210 and configured to provide electrical signals to the display substrate 210; and a first power supply signal line 230 and a second power supply signal line 240 both disposed on the display substrate 210 and configured to provide power supply signals to the light-emitting devices. Wherein, a terminal voltage of the light-emitting devices 150 of each row is a voltage difference between a first voltage of the first power supply signal line 230 positioned on each row of the display substrate 210 and a second voltage of the second power supply signal line 240 positioned on each row of the display substrate 210. When a first power supply input terminal A of the first power supply signal line 230 is disposed on one side adjacent to the printed circuit board 220 and a second power supply input terminal B of the second power supply signal line 240 is disposed on one side away from the printed circuit board 220, along a direction from adjacent to the printed circuit board to away from the printed circuit board, a difference value between terminal voltages of the light-emitting devices on two adjacent rows is less than a target difference value, which allows brightness of the light-emitting devices on each row of the display substrate to be substantially unchanged.

Specifically, the display substrate 210 includes a substrate (not shown in the figure) and a plurality of film layers disposed on the substrate. Wherein, structures of the substrate and the film layers may be structures familiar to a skilled person in the art, and are not described in detail here. The substrate may include a display area (an active area, an AA area for short) (not shown in the figure). The display area includes a plurality of pixel units (corresponding to the pixel circuits 211 shown in FIG. 3), and each of the pixel units may include a plurality of sub-pixels. Each of the sub-pixels includes one of the light-emitting devices and one of the pixel circuits 211 electrically connected to the light-emitting devices. The pixel circuits 211 are configured to drive the light-emitting devices to emit light. The pixel circuits 211 may include a current control circuit and a duration control circuit. In some embodiments of the present disclosure, the pixel circuits 211 are current control circuits. Wherein, the current control circuits may be a control circuit of 2T1C or 1T1MOS. In this embodiment, the control circuit of 1T1MOS is adopted. In practical applications, the pixel circuits 211 may have a structure and a working principle that are substantially same as those in related technologies, which should be understood by an ordinary skilled person in the art, and are not repeated herein and should not limit the present disclosure.

In this embodiment, the display device further includes the printed circuit board 220. Specifically, the printed circuit board 220 (PCB) may be a flexible printed circuit board, which is a high-precision printed circuit board, and is disposed on the side of the display substrate 210. In this embodiment, the printed circuit board 220 is disposed on a top of the display substrate 210. Further, the printed circuit board 220 may be configured to electrically connect a display panel of the display device to a motherboard circuit of the display device, thereby realizing signal transmission between the display panel and the motherboard circuit. In addition, the flexible printed circuit board may be bonded to a bending area of the substrate to prevent the flexible printed circuit board from occupying a bezel area of the display device, thereby reducing a bezel width of the display device and improving a screen ratio of the display device. In this embodiment, the printed circuit board 220 is configured to provide the electrical signals to the display substrate 210.

In this embodiment, the printed circuit board 220 may provide the power supply signals to the display substrate 210 via a plurality of connecting terminals 260 and power supply signal lines disposed on the display substrate 210. Wherein, the connecting terminals 260 and the printed circuit board 220 are disposed on a same side of the display substrate 210. In this embodiment, the power supply signal lines include the first power supply signal line 230 and the second power supply signal line 240. Lines described in the following refers to the power supply signal lines. Wherein, the first power supply signal line 230 is configured to provide the first voltage, the second power supply signal line 240 is configured to provide the second voltage, and the first voltage may be an operating voltage VDD or a common voltage VSS required to drive the light-emitting devices to emit light. The second voltage may be the operating voltage VDD or the common voltage VSS required to drive the light-emitting devices to emit light, which corresponds to the first voltage. For example, the first voltage is the operating voltage VDD and the second voltage is the common voltage VSS, or the first voltage is the common voltage VSS and the second voltage is the operating voltage VDD. In this embodiment, the first voltage being the operating voltage VDD and the second voltage being the common voltage VSS is taken as an example, that is, the first power supply signal line 230 provides the operating voltage VDD and the second power supply signal line 240 provides the common voltage VSS. The above settings are only examples, and are not intended to limit the present disclosure. It should be noted that generally, the operating voltage VDD is a high voltage, and the common voltage VSS is a low voltage.

Referring to FIG. 3, in this embodiment, the first power supply input terminal A of the first power supply signal line 230 is disposed on the side adjacent to the printed circuit board 220, and the second power supply input terminal B of the second power supply signal line 240 is disposed on the side away from the printed circuit board 220. Specifically, the printed circuit board 220 is connected to the first power supply input terminal A by one of the connecting terminals 260. At a same time, the printed circuit board 220 is connected to the second power supply input terminal B by another one of the connecting terminals 260 and an auxiliary line 270. Wherein, the auxiliary line 270 may be disposed along a bezel direction, one end of the auxiliary line 270 is connected to the another one of the connecting terminals 260, another end of the auxiliary line 270 is connected to the second power supply input terminal B, the connecting terminals 260 are positioned on the side adjacent to the printed circuit board 220, and the second power supply input terminal B is positioned on the side away from the printed circuit board 220. For example, the second power supply input terminal B is disposed on one end of the display device opposite to the printed circuit board 220. It should be noted that a connecting method among the auxiliary line, the connecting terminals, and the second power supply input terminal is not limited to this. The above connecting method is only an example, and is not intended to limit the present disclosure.

In current technology, the first power supply input terminal A of the first power supply signal line and the second power supply input terminal B of the second power supply signal line are simultaneously connected to the connecting terminals adjacent to the printed circuit board. That is, a common cathode connecting method or a common anode connecting method is adopted. However, a shortcoming of using these connecting methods is that along a direction from the side adjacent to the printed circuit board to the side away from the printed circuit board, a voltage value of the operating voltage VDD of each row on the display substrate is gradually reduced, while a voltage value of the common voltage VSS of each row is gradually increased, thereby causing the terminal voltage ($\Delta V=VDD-VSS$) applied to the light-emitting devices (for example, the organic light-emitting diodes) of each row to be gradually reduced and causing a current I to be correspondingly reduced in sequence. Therefore, a brightness performance from the side adjacent to the printed circuit board to the side away from the printed circuit board is reduced (since a reduction between the terminal voltages of the light-emitting devices on the two adjacent rows is larger, a brightness reduction between the light-emitting devices is also correspondingly larger). As such, a brightness difference between the light-emitting devices of each row may be overly large, and human vision will feel obvious uneven brightness, thereby affecting display quality.

Therefore, in this embodiment of the present disclosure, the first power supply input terminal A of the first power supply signal line 230 is disposed on the side adjacent to the printed circuit board 220, and the second power supply input terminal B of the second power supply signal line 240 is disposed on the side away from the printed circuit board 220. In such design, along the direction from the side adjacent to the printed circuit board 220 to the side away from the printed circuit board 220, the operating voltage VDD is gradually reduced, and at a same time, the common voltage VSS is also gradually reduced. In this embodiment, the display substrate 210 is divided into a plurality of rows and a plurality of columns, and each row and each column form corresponding pixel units. If it is assumed that a row closest to the printed circuit board 220 is a first row, and a row farthest from the printed circuit board 220 is a last row, the difference value between the terminal voltages ($\Delta V=VDD-VSS$) of the light-emitting devices on the two adjacent rows is less than the target difference value (that is, the reduction of the terminal voltages of the light-emitting devices is relatively small), thereby correspondingly reducing the difference value between currents flowing through the light-emitting devices. Therefore, brightness of the light-emitting devices of each row is substantially unchanged, the brightness difference can be reduced to an extent that cannot be easily recognized by human eyes, and uneven brightness of display can be improved.

Figure 1:
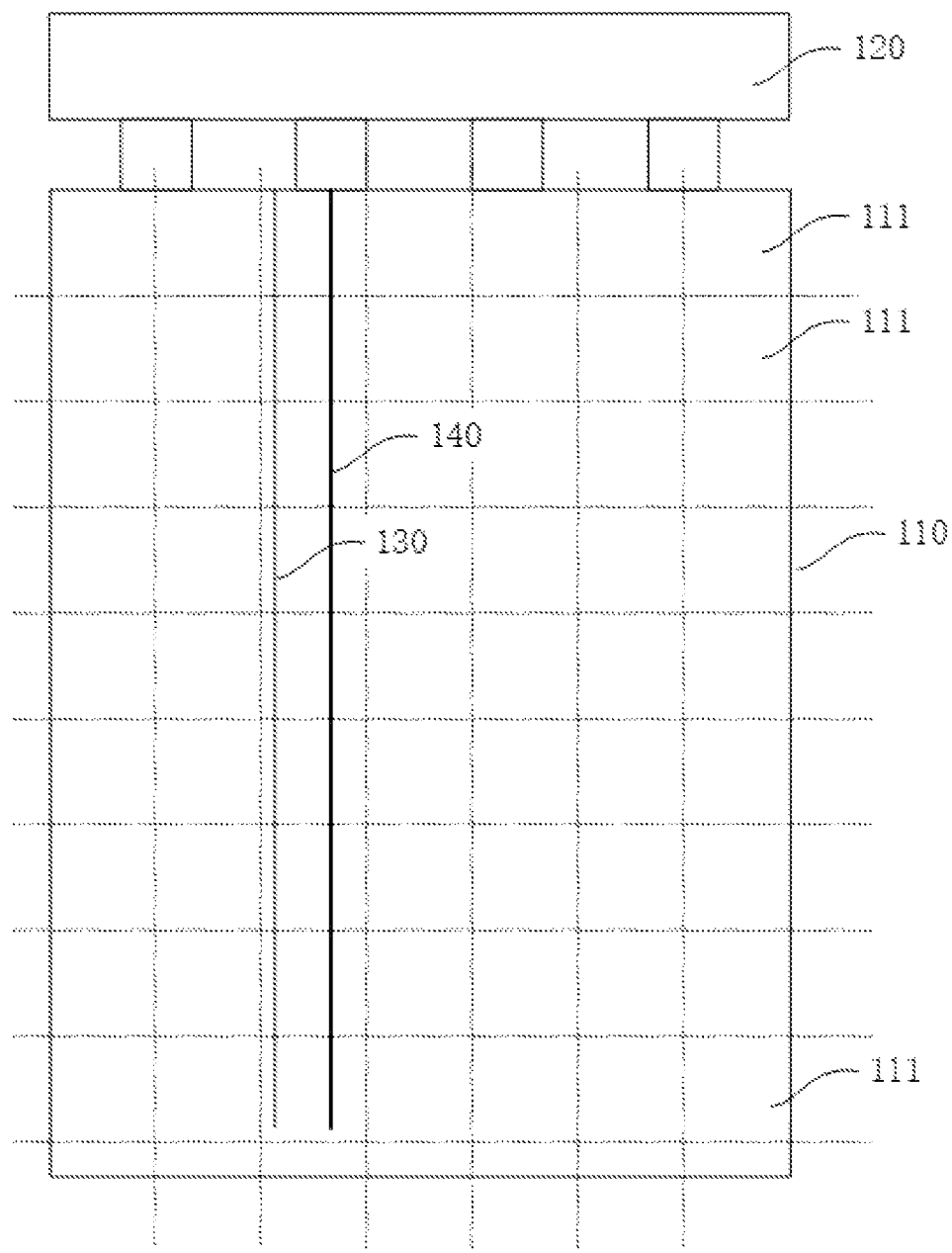
FIG. 1 is a schematic structural diagram of a display device in current technology.
Figure 2:
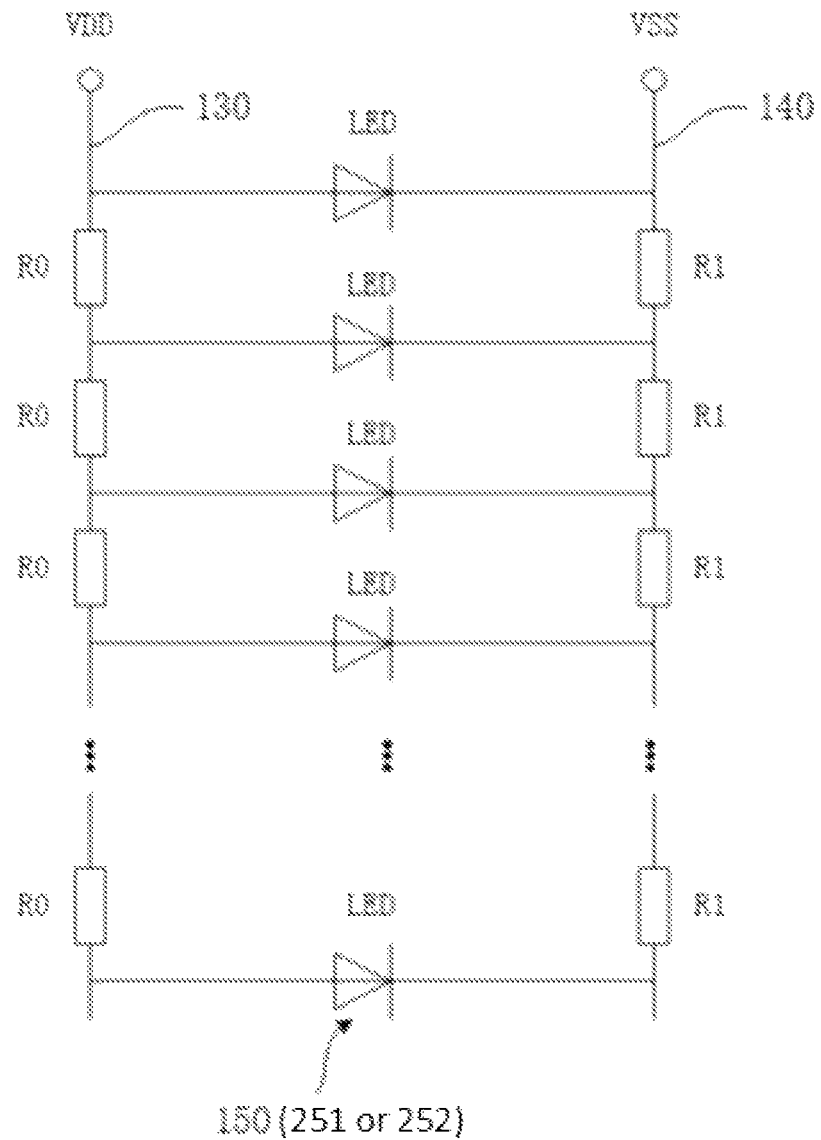
FIG. 2 is an equivalent circuit diagram of pixel drive of the display device shown in FIG. 1.

In some embodiments of the present disclosure, light-emitting parts of the light-emitting devices may include an electroluminescent layer 251, which can refer to FIG. 2. Specifically, a material of the electroluminescent layer 251 may include an electroluminescent material, such as an organic electroluminescent material and an inorganic electroluminescent material, and is not limited herein. In some embodiments of the present disclosure, the light-emitting parts of the light-emitting devices may also include a light-emitting diode (LED) chip 252, which can refer to FIG. 2. Specifically, a size of the LED chip 252 can be a micron level. Further, micro-light-emitting diodes (micro-LEDs) have advantages of high brightness, high luminous efficiency, and low power consumption. In some embodiments of the present disclosure, the LED chip 252 in the micron level may be a micro-LED chip. Or, in some embodiments of the present disclosure, a size of the micro-LED chip may also be a nano level. Further, mini-light-emitting diodes (mini-LEDs) have a smaller size and can achieve high-resolution display. In addition, in some embodiments, the organic light-emitting diodes (OLEDs) and the pixel circuits driving the OLEDs to emit light are manufactured on the substrate (for example, a glass substrate) to form an OLED panel.

In some embodiments of the present disclosure, the first power supply signal line 230 extends from the side adjacent to the printed circuit board 220 toward the side away from the printed circuit board 220. Similarly, the second power supply signal line 240 extends from the side away from the printed circuit board 220 toward the side adjacent to the printed circuit board 220. Specifically, the first power supply signal line 230 may extend along the side adjacent to the printed circuit board 220 toward the side away from the printed circuit board 220, and a disposition direction of the first power supply signal line 230 is perpendicular to a horizontal axis of the display device (the horizontal axis is parallel to a disposition direction of the printed circuit board 220). Of course, in other embodiments, the first power supply signal line 230 may extend along the side adjacent to the printed circuit board 220 toward the side away from the printed circuit board 220, and the disposition direction of the first power supply signal line 230 and the horizontal axis of the display device may form an angle less than 90 degrees. Similarly, the second power supply signal line 240 may extend along the side away from the printed circuit board 220 toward the side adjacent to the printed circuit board 220, and a disposition direction of the second power supply signal line 240 is perpendicular to the horizontal axis of the display device (the horizontal axis is parallel to the disposition direction of the printed circuit board 220). Of course, in other embodiments, the second power supply signal line 240 may extend along the side away from the printed circuit board 220 toward the side adjacent to the printed circuit board 220, and the disposition direction of the second power supply signal line 240 and the horizontal axis of the display device may form the angle less than 90 degrees.

Figure 4:
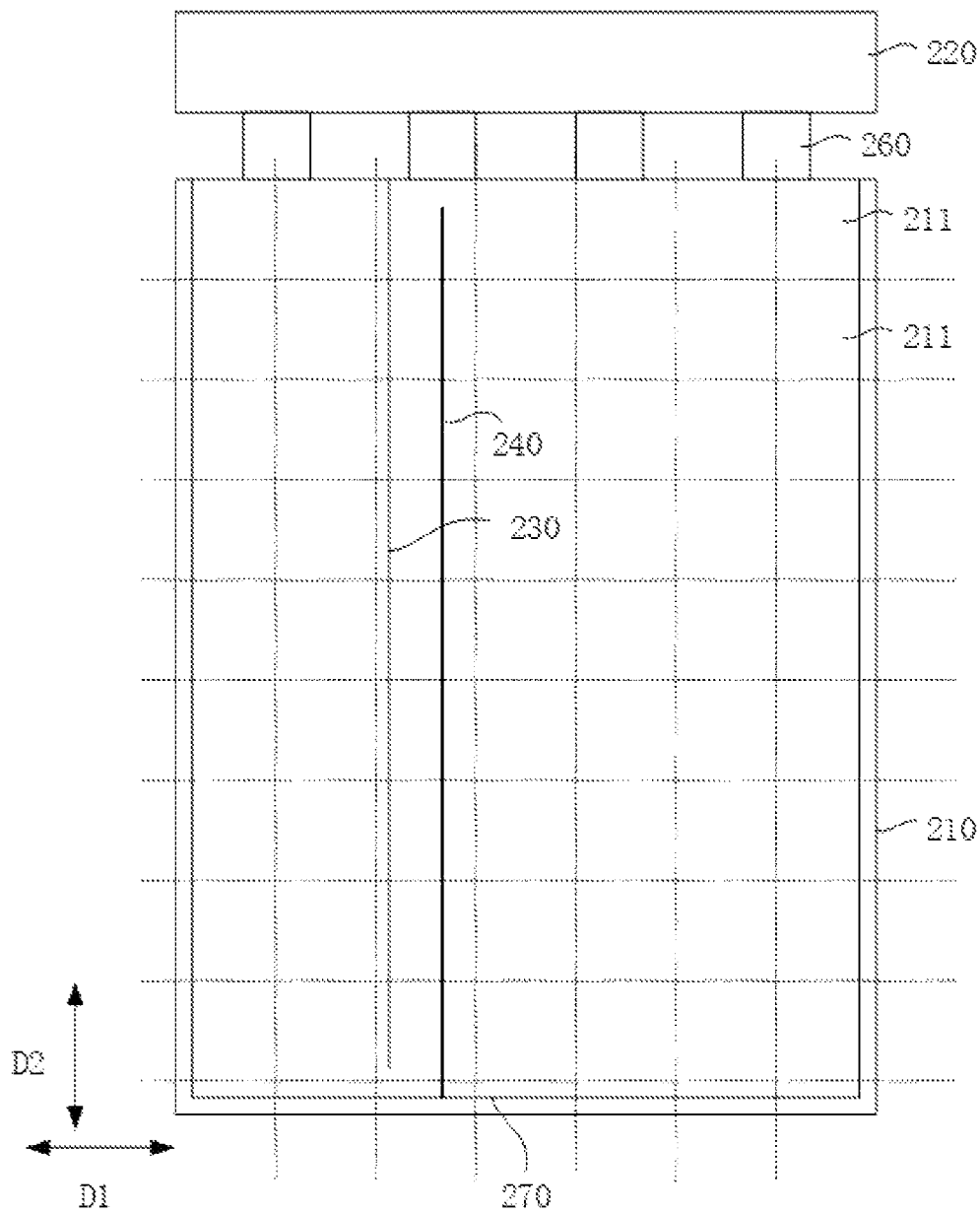
FIG. 4 is a schematic structural diagram of the display device according to another embodiment of the present disclosure.

Referring to FIG. 4, in another embodiment of the present disclosure, a width of the first power supply signal line 230 away from the printed circuit board 220 is greater than a width of the first power supply signal line 230 adjacent to the printed circuit board 220. Cross-sectional areas of the first power supply signal line 230 and the second power supply signal line 240 are related to widths of the first power supply signal line 230 and the second power supply signal line 240. A cross-sectional area of a line is equal to a line width multiplied by a line thickness, the line width is a width in a first direction D1 shown in FIGS. 4 and 5, and the line thickness is a thickness perpendicular to the first direction D1 and a second direction D2 shown in FIGS. 4 and 5. In a case of having a constant line thickness, when the line width changes, the cross-sectional area of the line will change correspondingly. In addition, since a resistance of the first power supply signal line 230 is related to a line resistivity, a line length, and the cross-sectional area of the line, when the line resistivity and the line length are constant, changing the cross-sectional area of the line will also correspondingly change the resistance of the first power supply signal line 230. Therefore, a resistance of the first power supply signal line 230 away from the printed circuit board 220 may be set to be relatively small, and a resistance of the first power supply signal line 230 adjacent to the printed circuit board 220 may be set to be relatively large. That is, the resistance of the first power supply signal line 230 away from the printed circuit board 220 is less than a first default resistance value, and the resistance of the first power supply signal line 230 adjacent to the printed circuit board 220 is greater than a second default resistance value. In such way, a problem of one power supply line adjacent to the connecting terminals 260 having a higher voltage and the power supply line away from the connecting terminals 260 having a lower voltage in current technology can be effectively overcome. Therefore, the difference value between the terminal voltages of the light-emitting devices of each row can be further reduced, thereby allowing the brightness difference between the light-emitting devices of two adjacent rows to be smaller and improving uniformity of displayed brightness of the display panel.

In other embodiments, a width of the second power supply signal line 240 away from the printed circuit board 220 may also be set to be greater than a width of the second power supply signal line 240 adjacent to the printed circuit board 220.

In order to realize the width of the first power supply signal line 230 away from the printed circuit board 220 being greater than the width of the first power supply signal line 230 adjacent to the printed circuit board 220, the first power supply signal line 230 may include a patterned structure. Wherein, the first power supply signal line 230 on the side adjacent to the printed circuit board 220 includes a plurality of first hollowed-out parts, the first power supply signal line 230 on the side away from the printed circuit board 220 includes a plurality of second hollowed-out parts, and a number of the first hollowed-out parts is greater than a number of the second hollowed-out parts.

Figure 5:
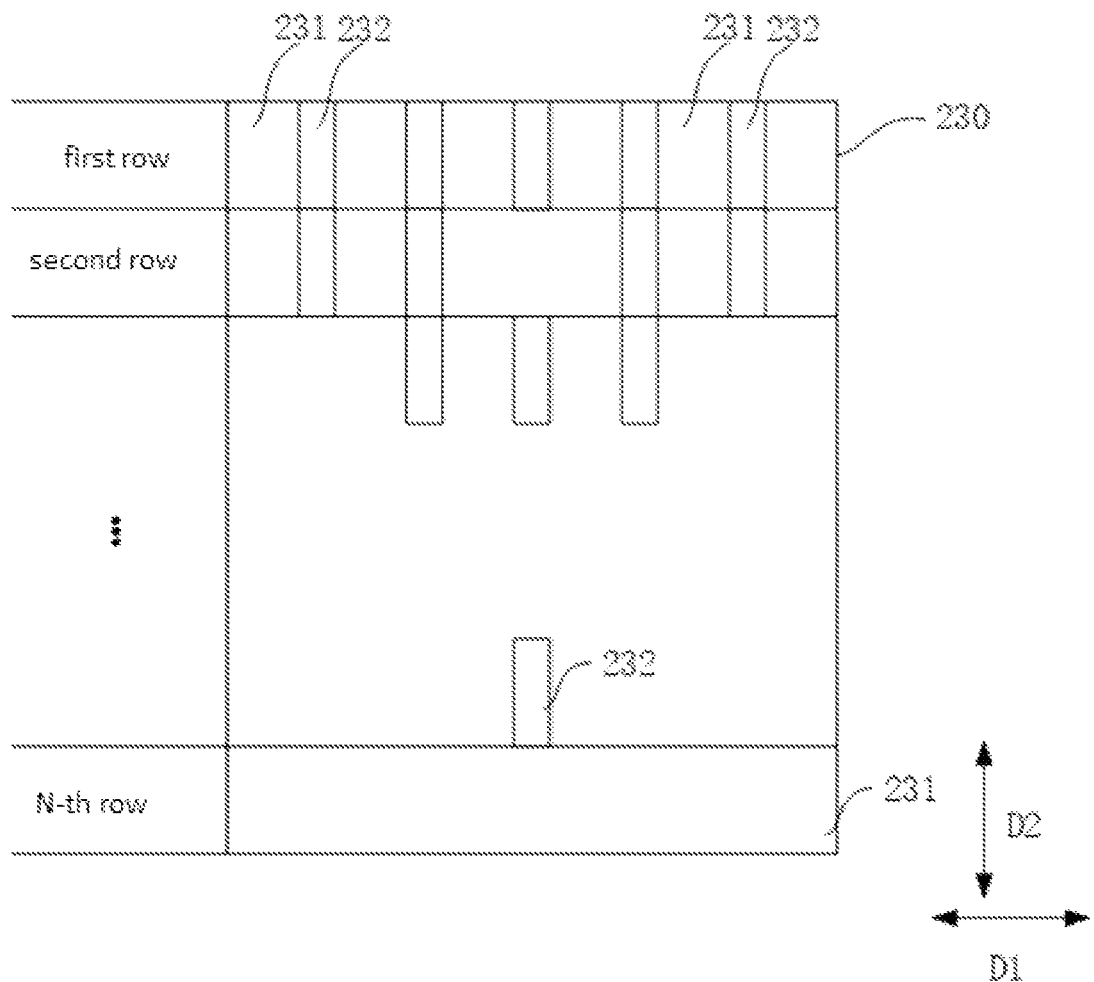
FIG. 5 is a schematic diagram of a patterned structure of a first power supply signal line shown in FIG. 4.

Specifically, the first power supply signal line 230 on the first row is patterned to form a line segment having a plurality of solid parts 231 and a plurality of hollowed-out parts 232 spaced apart from each other. As shown in FIG. 5, an orthographic projection of the line segment on the display substrate 210 includes a plurality of first rectangles and a plurality of second rectangles, the first rectangles correspond to the solid parts 231, and the second rectangles correspond to the hollowed-out parts 232. Similarly, the first power supply signal line 230 on a second row is patterned to form another line segment having the plurality of solid parts 231 and the plurality of hollowed-out parts 232 spaced apart from each other. As shown in FIG. 5, an orthographic projection of the line segment on the display substrate 210 includes the plurality of first rectangles and the plurality of second rectangles, the first rectangles correspond to the solid parts 231, and the second rectangles correspond to the hollowed-out parts 232. It should be noted that a number of the solid parts 231 and a number of the hollowed-out parts 232 on the second row are both less than a number of the solid parts 231 and a number of the hollowed-out parts 232 on the first row. Similarly, the first power supply signal line 230 on a third row is patterned to form yet another line segment having the plurality of solid parts 231 and the plurality of hollowed-out parts 232 spaced apart from each other. As shown in FIG. 5, an orthographic projection of the line segment on the display substrate 210 includes the plurality of first rectangles and the plurality of second rectangles, the first rectangles correspond to the solid parts 231, and the second rectangles correspond to the hollowed-out parts 232. It should be noted that a number of the solid parts 231 and a number of the hollowed-out parts 232 on the third row are both less than a number of the solid parts 231 and a number of the hollowed-out parts 232 on the second row. By analogy, the first power supply signal line 230 on an (n−1)th row is patterned to form a line segment having two solid parts 231 and one hollowed-out part 232 spaced apart from each other. As shown in FIG. 5, an orthographic projection of the line segment on the display substrate 210 includes two first rectangles and one second rectangle, the first rectangles correspond to the solid parts 231, and the second rectangle corresponds to the hollowed-out part 232. It should be noted that a number of the solid parts 231 and a number of the hollowed-out parts 232 on the (n−1)th row are both less than a number of the solid parts 231 and a number of the hollowed-out parts 232 on an (n−2)th row. Similarly, the first power supply signal line 230 on an n-th row (or on a last row) is patterned to form a line segment having one solid part 231 and zero hollowed-out part 232. As shown in FIG. 5, an orthographic projection of the line segment on the display substrate 210 includes one first rectangle and zero second rectangle, the first rectangle corresponds to the solid part 231, and the second rectangle corresponds to the hollowed-out part 232. It should be noted that a number of the solid parts 231 and a number of the hollowed-out parts 232 on the n-th row are both less than a number of the solid parts 231 and a number of the hollowed-out parts 232 on the (n−1)th row. The first power supply signal line 230 is formed by the above designing method, and a structure of the first power supply signal line 230 formed is equivalent to the width of the first power supply signal line 230 away from the printed circuit board 220 being greater than the width of the first power supply signal line 230 adjacent to the printed circuit board 220. In such way, the problem of the power supply line adjacent to the connecting terminals 260 having the higher voltage and the power supply line away from the connecting terminals 260 having the lower voltage in current technology can be effectively overcome. Therefore, the difference value between the terminal voltages of the light-emitting devices of two adjacent rows can be further reduced, thereby allowing the brightness difference between the light-emitting devices of each row to be smaller and improving the uniformity of displayed brightness of the display panel.

Figure 6:
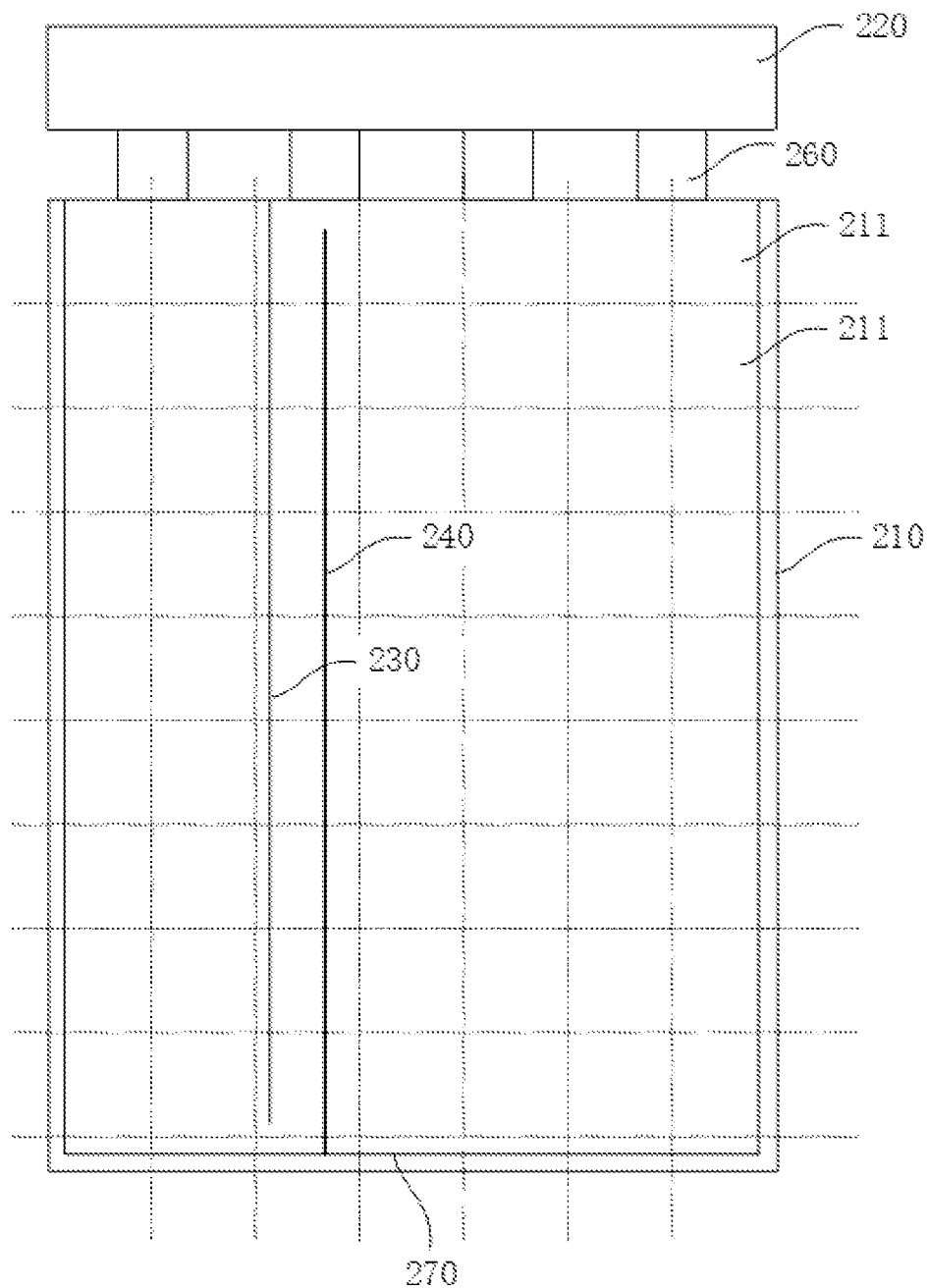
FIG. 6 is a schematic structural diagram of the display device according to yet another embodiment of the present disclosure.

Referring to FIG. 6, in yet another embodiment of the present disclosure, in a case of setting the width of the first power supply signal line 230 away from the printed circuit board 220 to be greater than the width of the first power supply signal line 230 adjacent to the printed circuit board 220, at a same time, the width of the second power supply signal line 240 away from the printed circuit board 220 is set to be greater than the width of the second power supply signal line 240 adjacent to the printed circuit board 220. Since a resistance of the second power supply signal line 240 is related to the line resistivity, the line length, and the cross-sectional area of the line, when the line resistivity and the line length are constant, changing the cross-sectional area of the line will also correspondingly change the resistance of the second power supply signal line 240. Therefore, a resistance of the second power supply signal line 240 away from the printed circuit board 220 may be set to be relatively small, and a resistance of the second power supply signal line 240 adjacent to the printed circuit board 220 may be set to be relatively large. In such way, the problem of the power supply line adjacent to the connecting terminals 260 having the higher voltage and the power supply line away from the connecting terminals 260 having the lower voltage in current technology can be effectively overcome. Therefore, the difference value between the terminal voltages of the light-emitting devices of two adjacent rows can be further reduced, thereby allowing the brightness difference between the light-emitting devices of each row to be smaller and improving the uniformity of displayed brightness of the display panel.

In order to realize the width of the second power supply signal line 240 away from the printed circuit board 220 being greater than the width of the second power supply signal line 240 adjacent to the printed circuit board 220, the second power supply signal line 240 may include the patterned structure. Wherein, the second power supply signal line on the side adjacent to the printed circuit board includes a plurality of third hollowed-out parts, the second power supply signal line on the side away from the printed circuit board includes a plurality of fourth hollowed-out parts, and a number of the third hollowed-out parts is greater than a number of the fourth hollowed-out parts.

Figure 7:
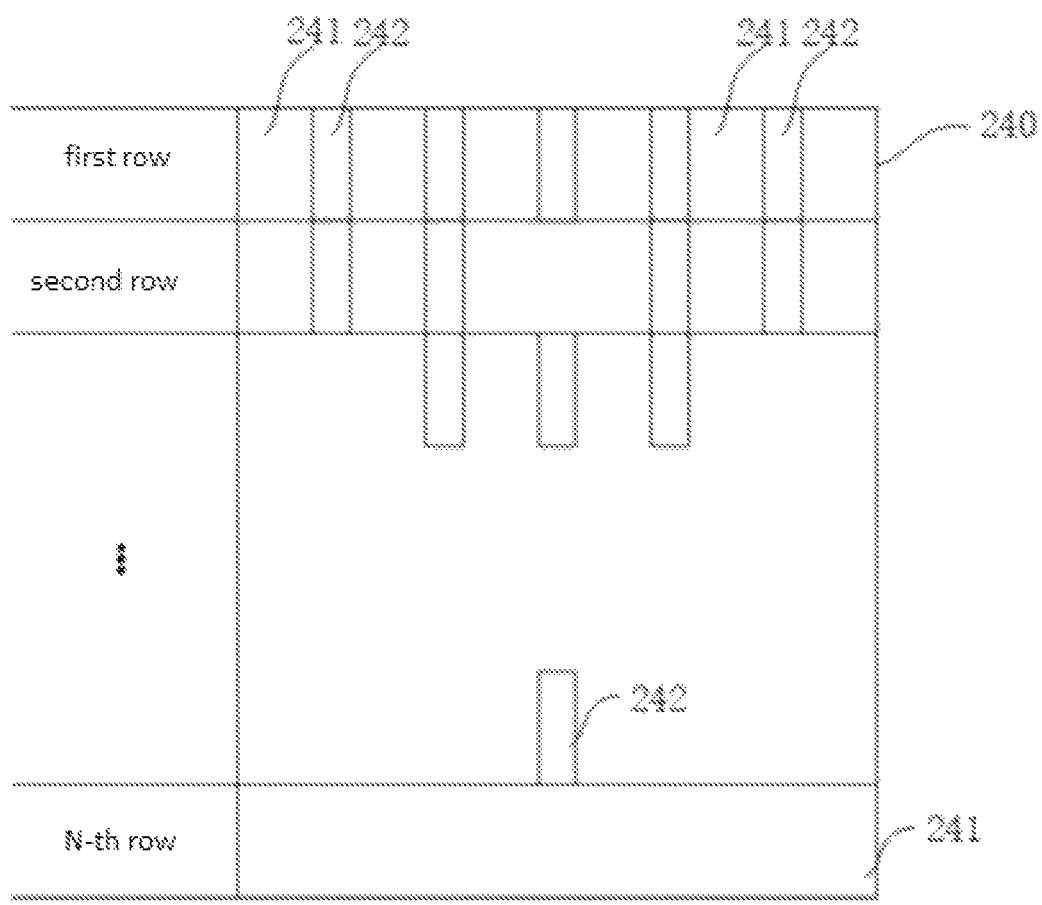
FIG. 7 is a schematic diagram of a patterned structure of a second power supply signal line shown in FIG. 6.

Specifically, the second power supply signal line 240 on the first row is patterned to form a line segment having a plurality of solid parts 241 and a plurality of hollowed-out parts 242 spaced apart from each other. As shown in FIG. 7, an orthographic projection of the line segment on the display substrate 210 includes the plurality of first rectangles and the plurality of second rectangles, the first rectangles correspond to the solid parts 241, and the second rectangles correspond to the hollowed-out parts 242. Similarly, the second power supply signal line 240 on the second row is patterned to form another line segment having the plurality of solid parts 241 and the plurality of hollowed-out parts 242 spaced apart from each other. As shown in FIG. 7, an orthographic projection of the line segment on the display substrate 210 includes the plurality of first rectangles and the plurality of second rectangles, the first rectangles correspond to the solid parts 241, and the second rectangles correspond to the hollowed-out parts 242. It should be noted that a number of the solid parts 241 and a number of the hollowed-out parts 242 on the second row are both less than a number of the solid parts 241 and a number of the hollowed-out parts 242 on the first row. Similarly, the second power supply signal line 240 on the third row is patterned to form another line segment having the plurality of solid parts 241 and the plurality of hollowed-out parts 242 spaced apart from each other. As shown in FIG. 7, an orthographic projection of the line segment on the display substrate 210 includes the plurality of first rectangles and the plurality of second rectangles, the first rectangles correspond to the solid parts 241, and the second rectangles correspond to the hollowed-out parts 242. It should be noted that a number of the solid parts 241 and a number of the hollowed-out parts 242 on the third row are both less than a number of the solid parts 241 and a number of the hollowed-out parts 242 on the second row. By analogy, the second power supply signal line 240 on the (n−1)th row is patterned to form a line segment having two solid parts 241 and one hollowed-out part 242 spaced apart from each other. As shown in FIG. 7, an orthographic projection of the line segment on the display substrate 210 includes two first rectangles and one second rectangle, the first rectangles correspond to the solid parts 241, and the second rectangle corresponds to the hollowed-out part 242. It should be noted that a number of the solid parts 241 and a number of the hollowed-out parts 242 on the (n−1)th row are both less than a number of the solid parts 241 and a number of the hollowed-out parts 242 on the (n−2)th row. Similarly, the second power supply signal line 240 on the n-th row (or on the last row) is patterned to form a line segment having one solid part 241 and zero hollowed-out part 242. Wherein, n is a number of rows equally divided and obtained according to a size of the display substrate 210, and n is greater than 1. As shown in FIG. 7, an orthographic projection of the line segment on the display substrate 210 includes one first rectangle and zero second rectangle, the first rectangle corresponds to the solid part 241, and the second rectangle corresponds to the hollowed-out part 242. It should be noted that a number of the solid parts 241 and a number of the hollowed-out parts 242 on the n-th row are both less than a number of the solid parts 241 and a number of the hollowed-out parts 242 on the (n−1)th row. The second power supply signal line 240 is formed by the above designing method, and a structure of the second power supply signal line 240 formed is equivalent to the width of the second power supply signal line 240 away from the printed circuit board 220 being greater than the width of the second power supply signal line 240 adjacent to the printed circuit board 220. In such way, the problem of the power supply line adjacent to the connecting terminals 260 having the higher voltage and the power supply line away from the connecting terminals 260 having the lower voltage in current technology can be effectively overcome. Therefore, the difference value between the terminal voltages of the light-emitting devices of two adjacent rows can be further reduced, thereby allowing the brightness difference between the light-emitting devices of each row to be smaller and improving the uniformity of displayed brightness of the display panel.

Preferably, in yet another embodiment of the present disclosure, when the second power supply signal line 240 is set to have the patterned structure, the first power supply signal line 230 is also set to have the patterned structure. Specifically, the patterned structure of the second power supply signal line 240 may be set to be different from the patterned structure of the first power supply signal line 230, or the patterned structures of both may be set to be same. Preferably, when the patterned structures of both are set to be the same, the difference value between the terminal voltages of the light-emitting devices of two adjacent rows can be further reduced, thereby allowing the brightness difference between the light-emitting devices of each row to be smaller and improving the uniformity of displayed brightness of the display panel. In other embodiments, the first power supply signal line 230 and the second power supply signal line 240 may also be patterned to form a target structure, thereby allowing a value of the terminal voltages of the light-emitting devices of each row on the display substrate to be unchanged and thus improving the uniformity of brightness of the display panel.

In addition, in other embodiments of the present disclosure, the first power supply signal line 230 and the second power supply signal line 240 may be disposed on different film layers of the substrate to increase an area of the power supply signal lines, thereby reducing the resistances of the power supply signal lines and further alleviating a phenomenon of uneven display caused by voltage drops (IR drops).

In the above embodiments, the description of each embodiment has its own emphasis. For a part that is not described in detail in an embodiment, refer to the related descriptions of other embodiments.

The display device provided by the present disclosure are described in detail above. The specific examples are applied in the description to explain the principle and implementation of the disclosure. The description of the above embodiments is only for helping to understand the technical solution of the present disclosure and its core ideas, and it is understood that many changes and modifications to the described embodiment can be carried out without departing from the scope and the spirit of the disclosure that is intended to be limited only by the appended claims.

What is claimed is:

1. A display device, comprising:
a display substrate, wherein a plurality of light-emitting devices are disposed on the display substrate in an array;
a printed circuit board disposed on one side of the display substrate; and
a first power supply signal line and a second power supply signal line both configured to provide power supply signals to the light-emitting devices;
wherein when a first power supply input terminal of the first power supply signal line is disposed on one side adjacent to the printed circuit board and a second power supply input terminal of the second power supply signal line is disposed on one side away from the printed circuit board, along a direction from adjacent to the printed circuit board to away from the printed circuit board, a difference value between terminal voltages of the light-emitting devices on two adjacent rows is less than a target difference value to allow brightness of the light-emitting devices on each row of the display substrate to be substantially unchanged;
wherein the first power supply signal line corresponding to a first row of the light-emitting devices comprises a plurality of solid parts and a plurality of hollowed-out parts spaced apart from each other; the first power supply signal line corresponding to a second row of the light-emitting devices comprises a plurality of solid parts and a plurality of hollowed-out parts spaced apart from each other, and a number of the solid parts and a number of the hollowed-out parts corresponding to the second row are both less than a number of the solid parts and a number of the hollowed-out parts corresponding to the first row; the first power supply signal line corresponding to a third row of the light-emitting devices comprises a plurality of solid parts and a plurality of hollowed-out parts spaced apart from each other, and a number of the solid parts and a number of the hollowed-out parts corresponding to the third row are both less than a number of the solid parts and a number of the hollowed-out parts corresponding to the second row; and by analogy, the first power supply signal line corresponding to an (N−1)-th row of the light-emitting devices comprises two solid parts and one hollowed-out part spaced apart from each other, and a number of the solid parts and a number of the hollowed-out parts corresponding to the (N−1)-th row are both less than a number of the solid parts and a number of the hollowed-out parts corresponding to the (N−2)-th row; and the first power supply signal line corresponding to an N-th row of the light-emitting devices comprises one solid part and zero hollowed-out part, and a number of the solid parts and a number of the hollowed-out parts corresponding to the N-th row are both less than a number of the solid parts and a number of the hollowed-out parts corresponding to the (N−1)-th row; and wherein a direction from the first row to the N-th row is the direction from adjacent to the printed circuit board to away from the printed circuit board, and N is an integer greater than 2.

2. The display device according to claim 1, wherein the first power supply signal line extends from the side adjacent to the printed circuit board toward the side away from the printed circuit board, and the second power supply signal line extends from the side away from the printed circuit board toward the side adjacent to the printed circuit board.

3. The display device according to claim 1, wherein the first power supply signal line comprises a patterned structure.

4. The display device according to claim 1, wherein the second power supply signal line comprises a patterned structure.

5. The display device according to claim 1, wherein the first power supply signal line on the side adjacent to the printed circuit board comprises a plurality of first hollowed-out parts, the first power supply signal line on the side away from the printed circuit board comprises a plurality of second hollowed-out parts, and a number of the first hollowed-out parts is greater than a number of the second hollowed-out parts.

6. The display device according to claim 5, wherein the second power supply signal line on the side adjacent to the printed circuit board comprises a plurality of third hollowed-out parts, the second power supply signal line on the side away from the printed circuit board comprises a plurality of fourth hollowed-out parts, and a number of the third hollowed-out parts is greater than a number of the fourth hollowed-out parts.

7. The display device according to claim 1, wherein the first power supply signal line and the second power supply signal line are disposed on different film layers of the display substrate.

8. The display device according to claim 1, wherein materials of the first power supply signal line and the second power supply signal line are same.

9. The display device according to claim 1, wherein values of the terminal voltages of the light-emitting devices on each row of the display substrate are unchanged.

10. A display device, comprising:
a display substrate, wherein a plurality of light-emitting devices are disposed on the display substrate in an array;
a printed circuit board disposed on one side of the display substrate; and
a first power supply signal line and a second power supply signal line both configured to provide power supply signals to the light-emitting devices;
wherein when a first power supply input terminal of the first power supply signal line is disposed on one side adjacent to the printed circuit board and a second power supply input terminal of the second power supply signal line is disposed on one side away from the printed circuit board, along a direction from adjacent to the printed circuit board to away from the printed circuit board, a difference value between terminal voltages of the light-emitting devices on two adjacent rows is less than a target difference value to allow brightness of the light-emitting devices on each row of the display substrate to be substantially unchanged;

wherein the first power supply signal line comprises a patterned structure, and the second power supply signal line comprises a patterned structure;

wherein the first power supply signal line on the side adjacent to the printed circuit board comprises a plurality of first hollowed-out parts, the first power supply signal line on the side away from the printed circuit board comprises a plurality of second hollowed-out parts, and a number of the first hollowed-out parts is greater than a number of the second hollowed-out parts; and wherein the second power supply signal line on the side adjacent to the printed circuit board comprises a plurality of third hollowed-out parts, the second power supply signal line on the side away from the printed circuit board comprises a plurality of fourth hollowed-out parts, and a number of the third hollowed-out parts is greater than a number of the fourth hollowed-out parts;

wherein the first power supply signal line corresponding to a first row of the light-emitting devices comprises a plurality of solid parts and a plurality of hollowed-out parts spaced apart from each other; the first power supply signal line corresponding to a second row of the light-emitting devices comprises a plurality of solid parts and a plurality of hollowed-out parts spaced apart from each other, and a number of the solid parts and a number of the hollowed-out parts corresponding to the second row are both less than a number of the solid parts and a number of the hollowed-out parts corresponding to the first row; the first power supply signal line corresponding to a third row of the light-emitting devices comprises a plurality of solid parts and a plurality of hollowed-out parts spaced apart from each other, and a number of the solid parts and a number of the hollowed-out parts corresponding to the third row are both less than a number of the solid parts and a number of the hollowed-out parts corresponding to the second row; and by analogy, the first power supply signal line corresponding to an (N−1)-th row of the light-emitting devices comprises two solid parts and one hollowed-out part spaced apart from each other, and a number of the solid parts and a number of the hollowed-out parts corresponding to the (N−1)-th row are both less than a number of the solid parts and a number of the hollowed-out parts corresponding to the (N−2)-th row; and the first power supply signal line corresponding to an N-th row of the light-emitting devices comprises one solid part and zero hollowed-out part, and a number of the solid parts and a number of the hollowed-out parts corresponding to the N-th row are both less than a number of the solid parts and a number of the hollowed-out parts corresponding to the (N−1)-th row; and wherein a direction from the first row to the N-th row is the direction from adjacent to the printed circuit board to away from the printed circuit board, and N is an integer greater than 2.

11. The display device according to claim 10, wherein the first power supply signal line extends from the side adjacent to the printed circuit board toward the side away from the printed circuit board, and the second power supply signal line extends from the side away from the printed circuit board toward the side adjacent to the printed circuit board.

12. The display device according to claim 10, wherein the first power supply signal line and the second power supply signal line are disposed on different film layers of the display substrate.

13. The display device according to claim 10, wherein materials of the first power supply signal line and the second power supply signal line are same.

14. The display device according to claim 10, wherein values of the terminal voltages of the light-emitting devices on each row of the display substrate are unchanged.

15. The display device according to claim 1, wherein the second power supply signal line corresponding to a first row of the light-emitting devices comprises a plurality of solid parts and a plurality of hollowed-out parts spaced apart from each other; the second power supply signal line corresponding to a second row of the light-emitting devices comprises a plurality of solid parts and a plurality of hollowed-out parts spaced apart from each other, and a number of the solid parts and a number of the hollowed-out parts corresponding to the second row are both less than a number of the solid parts and a number of the hollowed-out parts corresponding to the first row; the second power supply signal line corresponding to a third row of the light-emitting devices comprises a plurality of solid parts and a plurality of hollowed-out parts spaced apart from each other, and a number of the solid parts and a number of the hollowed-out parts corresponding to the third row are both less than a number of the solid parts and a number of the hollowed-out parts corresponding to the second row; and by analogy, the second power supply signal line corresponding to an (N−1)-th row of the light-emitting devices comprises two solid parts and one hollowed-out part spaced apart from each other, and a number of the solid parts and a number of the hollowed-out parts corresponding to the (N−1)-th row are both less than a number of the solid parts and a number of the hollowed-out parts corresponding to the (N−2)-th row; and the second power supply signal line corresponding to an N-th row of the light-emitting devices comprises one solid part and zero hollowed-out part, and a number of the solid parts and a number of the hollowed-out parts corresponding to the N-th row are both less than a number of the solid parts and a number of the hollowed-out parts corresponding to the (N−1)-th row.

16. The display device according to claim 10, wherein the second power supply signal line corresponding to a first row of the light-emitting devices comprises a plurality of solid parts and a plurality of hollowed-out parts spaced apart from each other; the second power supply signal line corresponding to a second row of the light-emitting devices comprises a plurality of solid parts and a plurality of hollowed-out parts spaced apart from each other, and a number of the solid parts and a number of the hollowed-out parts corresponding to the second row are both less than a number of the solid parts and a number of the hollowed-out parts corresponding to the first row; the second power supply signal line corresponding to a third row of the light-emitting devices comprises a plurality of solid parts and a plurality of hollowed-out parts spaced apart from each other, and a number of the solid parts and a number of the hollowed-out parts corresponding to the third row are both less than a number of the solid parts and a number of the hollowed-out parts corresponding to the second row; and by analogy, the second power supply signal line corresponding to an (N−1)-th row of the light-emitting devices comprises two solid parts and one hollowed-out part spaced apart from each other, and a number of the solid parts and a number of the hollowed-out parts corresponding to the (N−1)-th row are both less than a number of the solid parts and a number of the hollowed-out parts corresponding to the (N−2)-th row; and the second power supply signal line corresponding to an N-th row of the light-emitting devices comprises one solid part and zero hollowed-out part, and a number of the solid parts and a number of the hollowed-out parts corresponding to the N-th row are both less than a number of the solid parts and a number of the hollowed-out parts corresponding to the (N−1)-th row.

* * * * *